(12) United States Patent
Dagan

(10) Patent No.: US 7,433,429 B2
(45) Date of Patent: Oct. 7, 2008

(54) DE-INTERLEAVER METHOD AND SYSTEM

(75) Inventor: Amit Dagan, Shimshit (IL)

(73) Assignee: Intel Corporation, Santa Clara, CA (US)

( * ) Notice: Subject to any disclaimer, the term of this patent is extended or adjusted under 35 U.S.C. 154(b) by 890 days.

(21) Appl. No.: 10/199,663

(22) Filed: Jul. 19, 2002

(65) Prior Publication Data

US 2004/0015665 A1  Jan. 22, 2004

(51) Int. Cl.
H04L 27/06 (2006.01)
H04L 5/12 (2006.01)
G06F 12/00 (2006.01)

(52) U.S. Cl. .................. 375/341; 375/262; 714/795; 711/5; 711/127; 711/157

(58) Field of Classification Search .......... 375/261, 375/262, 265, 340, 341; 370/341; 711/5, 711/127, 157, 219; 714/794–796

See application file for complete search history.

(56) References Cited

U.S. PATENT DOCUMENTS

| | | | |
|---|---|---|---|
| 4,394,642 A | 7/1983 | Currie et al. | |
| 4,677,624 A | 6/1987 | Betts et al. | |
| 5,327,227 A | 7/1994 | Han | |
| 5,455,829 A | 10/1995 | Klingberg | |
| 5,502,696 A | 3/1996 | Yoon et al. | |
| 5,828,671 A | 10/1998 | Vela et al. | |
| 5,844,946 A | 12/1998 | Nagayasu | |
| 5,862,189 A | 1/1999 | Huisken et al. | |
| 5,928,371 A | 7/1999 | Robinson, Jr. et al. | |
| 5,940,863 A | 8/1999 | Fimoff et al. | |
| 5,943,371 A * | 8/1999 | Beale et al. | 375/341 |
| 5,946,707 A | 8/1999 | Krakirian | |
| 5,991,857 A | 11/1999 | Koetje et al. | |
| 5,995,080 A | 11/1999 | Biro et al. | |
| 6,075,828 A | 6/2000 | DeLaruelle et al. | |
| 6,094,739 A | 7/2000 | Miller et al. | |
| 6,115,435 A * | 9/2000 | Harada et al. | 375/341 |
| 6,151,690 A | 11/2000 | Peeters | |
| 6,185,200 B1 | 2/2001 | Prasad | |
| 6,195,344 B1 | 2/2001 | Prasad | |
| 6,329,935 B1 | 12/2001 | Stephen | |
| 6,392,572 B1 * | 5/2002 | Shiu et al. | 341/81 |
| 6,574,049 B1 | 6/2003 | Qian et al. | |
| 6,639,954 B2 * | 10/2003 | Kuroiwa et al. | 375/341 |

OTHER PUBLICATIONS

ETSI TR 101475 v.1.3.1 (ETSI—European Telecommunications Standards Institute, Sophia Antipolis, France, 2000).
Information technology—Open Systems Interconnection—Basic Reference Model: The Basic Model, International Standard, ISO/IEC 7498-1, Second Edition Nov. 15, 1994.
Part 11: Wireless LAN Medium Access Control (MAC) and Physical Layer (PHY) Specifications High-speed Physical Layer in the 5 GHz Band, Supplement to IEEE Standard for Information Technology, ISSS Std. 802.11a-1999 (R2003), Reaffirmed Jun. 12, 2003.

* cited by examiner

Primary Examiner—Young T. Tse
(74) Attorney, Agent, or Firm—Blakely, Sokoloff, Taylor & Zaffman LLP

(57) ABSTRACT

In one embodiment, interleaved signals in a receiver are accessed by memory pointers and delivered to data stream locations without the need to transfer data to an intermediate physical buffer.

21 Claims, 4 Drawing Sheets

|   | | 54 & 48 Mbps | 36 & 24 Mbps | 18 & 12 Mbps | 9 & 6 Mbps |
|---|---|---|---|---|---|
| a | Number of bits per OFDM symbol | 288 | 192 | 96 | 48 |
| b | Number of memory pointers | 3 | 2 | 2 | 2 |
| c | Pointer increment value (decimal) | 54 | 24 | 12 | 6 |
| d | Starting address of the different pointers (hex) | Pointer 1: 0x0<br>Pointer 2: 0x14<br>Pointer 3: 0x25 | Pointer 1: 0x0<br>Pointer 2: 0xD | Pointer 1: 0x0<br>Pointer 2: 0x6 | Pointer 1: 0x0<br>Pointer 2: 0x3 |
| e | Pointers adjustment table<br>• These adjustments should be added to the value of the last address every time the pointers overflow the input buffer<br>• Numbers are negative in decimal format | Iteration 3N:<br>　Pointer 1: −286<br>　Pointer 2: −289<br>　Pointer 3: −289<br>Iteration 3N + 1:<br>　Pointer 1: −289<br>　Pointer 2: −289<br>　Pointer 3: −286<br>Iteration 3N + 2:<br>　Pointer 1: −286<br>　Pointer 2: −283<br>　Pointer 3: −286<br><br>N=0,1...5 | Iteration 2N:<br>　Pointer 1: −191<br>　Pointer 2: −193<br>Iteration 2N + 1:<br>　Pointer 1: −191<br>　Pointer 2: −189<br><br><br><br><br><br><br><br>N=0,1...5 | All iterations:<br>　Pointer 1: −95<br>　Pointer 2: −95 | All iterations:<br>　Pointer 1: −47<br>　Pointer 2: −47 |

| Pointer 1 | Pointer 2 | Pointer 3 |
|---|---|---|
| 0 | 20 | 37 |
| 54 | 74 | 91 |
| 103 | 128 | 145 |
| 162 | 182 | 199 |
| 216 | 236 | 253 |
| 270 | 1 | 18 |
| 38 | 55 | 72 |
| 92 | 109 | 126 |
| 146 | 163 | 180 |
| 200 | 217 | 234 |
| 254 | 271 | 2 |
| 19 | 36 | 56 |
| 73 | 90 | 110 |
| 127 | 144 | 164 |
| 181 | 198 | 218 |
| 235 | 252 | 272 |
| 3 | 25 | 40 |

DE-INTERLEAVER METHOD AND SYSTEM

FIELD

Embodiments of the invention relate generally to data manipulation, and more particularly to methods, systems, and machine-readable media for de-interleaving data transmitted in accordance with a protocol.

BACKGROUND

The manner of transmitting messages between any two points in a telecommunication network is open systems interconnection (OSI). The open system interconnection basic model is described in International Organization for Standardization standard ISO/IEC 7498-1:1994 (ISO, Geneva, 1997). The OSI model uses a seven-layer network architecture. Layer one, the Physical Layer conveys a bit stream to be transmitted through the network at the electrical and mechanical level. It provides the hardware for sending and receiving data on a carrier.

To reduce the chance of data error, a transmit pipe of a wireless LAN (Local Area Network) protocol generates two encoded data streams from an input data stream. The two encoded streams are interleaved prior to transmission. In a receiver, a de-interleaver restores interleaved data to the original order of the encoded data streams. A currently preferred context for performance of de-interleaving is in accordance with a wireless LAN communication protocol set forth by Institute of Electrical and Electronics Engineers (IEEE) Standard 802.11a entitled "Standard for Telecommunications and Information Exchange Between Systems LAN/MAN Specific Requirements - Part 11: Wireless Medium Access Control (MAC) and physical layer (PHY) specifications: High Speed Physical Layer in the 5 GHz band" (1999).

Bits are provided to the de-interleaver from a de-mapper. The de-mapper may reach a decision as to the value of each transmitted bit and generates a single "receiver best guess" bit for every transmitted bit. This approach is known as a "hard decision." Alternatively, a de-mapper may generate several bits, i.e. a metric, for every transmitted bit. These bits represent a probability that a particular transmitted bit was either a "one" or a "zero." This approach is known as a "soft decision."

The standard de-interleaver implementation generates the de-interleaved stream by moving data into a new buffer and reordering the metrics according to their correct order while doing so. This prior art practice requires machine complexity and cycle time for each operation performed.

In the IEEE 802.11a standard, two permutations define the mapping of each metric from its location in an input buffer to its location in a de-interleaved stream. The de-interleaver permutations are defined as follows:

J denotes the index to the interleaved input buffer before the first permutation;

I denotes the index after the first permutation; and

K denotes the index in the de-interleaved stream after the second permutation.

$$i = s*\text{floor}(j/s) + (j + \text{floor}(16*j/N_{CBPS})) \mod s \quad (1)$$

where $j=0, 1, \ldots, N_{CBPS}-1$ and where $s = \max(N_{BPSC}/2, 1)$ $$k = 16*i - (N_{CBPS}-1)*\text{floor}(16*i/N_{CBPS})$$

where $i=0, 1, \ldots N_{CBPS}-1$.

$N_{CBPS}$ is number of coded bits per symbol.

$N_{BPSC}$ is the number of bits per sub-carrier.

BRIEF DESCRIPTION OF THE DRAWINGS

Embodiments of the invention may be further understood by reference to the following description taken in connection with the following drawings.

Of the drawings:

FIG. 3 is an exemplary chart illustrating significant operating parameters for various bit rates to operate in accordance with IEEE 802.11a;

FIG. 4 is an exemplary chart illustrating incrementing values of addresses which the pointers access.

DETAILED DESCRIPTION OF THE INVENTION

Figure 1:
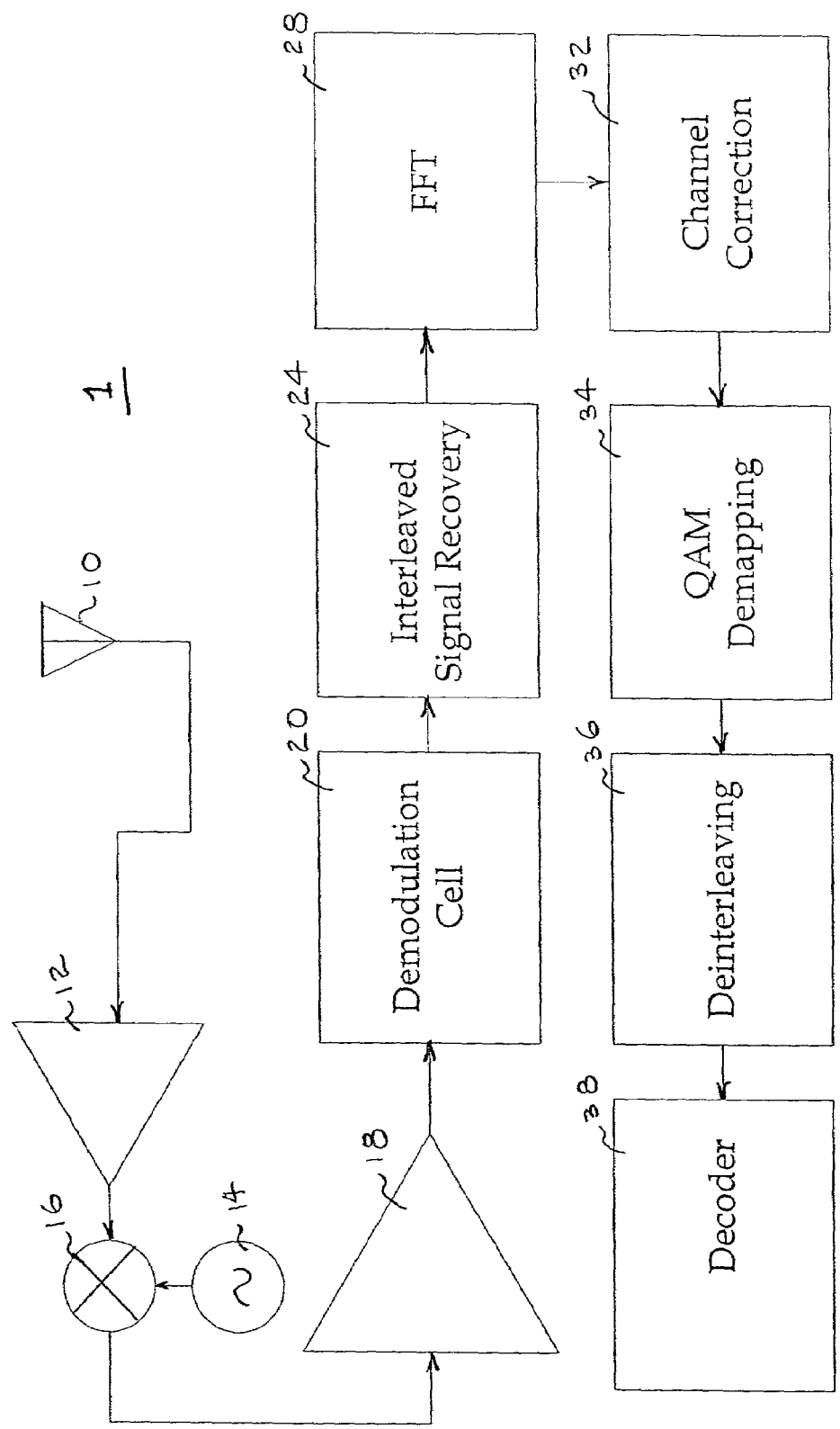
FIG. 1 is an exemplary block diagram of a digital receiver incorporating an embodiment of the invention.

FIG. 1 is an exemplary block diagram of a receiver 1. The receiver 1 de-interleaves coded signals and decodes the signals. Interleaving is a well-known technique in transmitting digital signals. The form of transmission for the interleaved signals will often be orthogonal frequency division multiplexing (OFDM) since this is a powerful technique in addressing multipath defects and is particularly useful in transmitting steaming video. This technique is described in accordance with IEEE 802.11a standard, but the invention may be applicable to other forms of transmission using interleaved signals such as in the context of the European Hiper-LAN/2 system as described, for example, in ETSI TR 101475 v.1.3.1 (ETSI—European Telecommunications Standards Institute, Sophia Antipolis, France, 2000).

Herein, the "receiver" comprises circuitry (e.g., integrated circuits, combinatorial logic, etc.) to perform a selected functionality. It is contemplated, however, that the functionality of some of the circuitry may be accomplished through the use of executable software, operating in combination with hardware such as a processor. The software is stored in a machine-readable medium, namely any medium that can store or transfer information. Examples of the machine readable medium may include an electronic circuit, a semiconductor memory device, a read only memory (ROM), a flash memory, an erasable programmable ROM (EPROM), a fiber optic medium, a radio frequency (RF) link, and removable readable media such as a floppy diskette, a CD-ROM, an optical disk, a hard disk, etc.

According to the IEEE 802.11a standard, the data bits should be interleaved by block interleaving with a block size corresponding to the number of coded bits per OFDM symbol, $N_{CBPS}$, as described above. Interleaving is achieved by a two-step permutation. First, adjacent coded bits are mapped onto non-adjacent sub-carriers. A high-rate data stream is split into a number of lower-rate streams that are transmitted simultaneously over a number of sub-carriers. The second permutation ensures that adjacent coded bits are mapped alternately onto less and more significant bits of the signal constellation. Therefore, long-run, low-reliability least significant bits are avoided.

While the standard calls for block interleaving, if desired, convolutional interleaving could be provided in the alternative. The receiver of FIG. 1 should process digital signals in a known manner prior to decoding.

The receiver 1 comprises an antenna 10 which provides an input signal to a low noise amplifier 12. The input signal is mixed with an intermediate frequency signal from a source 14 by a mixer 16 to provide an input to an automatic gain control amplifier 18. The output of the automatic gain control amplifier 18 is provided to a demodulation cell 20 which includes a conventional Gilbert cell IQ detector and automatic frequency control recovery circuit. The demodulation cell 20 provides an input to an interleaved signal recovery circuit 24.

The interleaved signal recovery circuit 24 includes conventional circuitry for recovering timing and frequency synchronization from the input signal, establishing symbol timing and correcting the frequency signal. The interleaved signal recovery circuit 24 provides the recovered interleaved signal to a fast Fourier transform (FFT) 28 which provides a signal to channel correction circuit 32. The interleaved signal recovery circuit 24 also removes conventional additional bits added to the transmitted blocks for conventional interleaving purposes.

A quadrature amplitude modulation (QAM) de-mapping circuit 34 returns the bits to a single interleaved stream. The de-mapper will generate a single "receiver best guess" bit for every transmitted bit to make a "hard decision" or make a "soft decision." In one embodiment of the invention, the QAM de-mapping circuit 34 generates several bits, known as a metric, for every transmitted bit. These bits represent the probability that the transmitted bit was either a 0 or 1. This approach is known as a "soft-decision." In embodiments of the invention, "smart" memory pointers will directly access an input buffer data stream generated by the QAM de-mapping circuit 34. A sequence of pointer references is generated and provided to a decoder 38, which is preferably a Viterbi decoder. De-interleaving circuitry 36 generates a de-interleaved stream of metrics without moving data from the QAM de-mapping circuit 34 to a new physical buffer intermediate to the QAM de-mapping circuit 34 and the Viterbi decoder 38.

Figure 2:
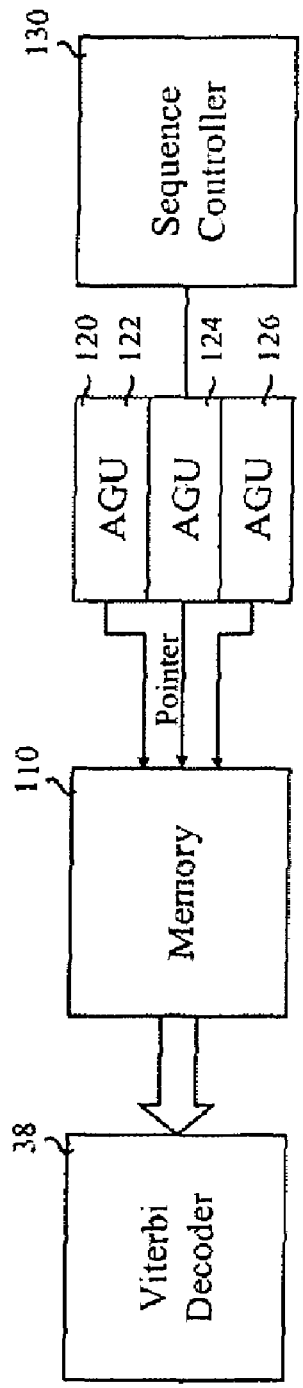
FIG. 2 is an exemplary block diagram illustrating the implementation of "smart" memory pointers directly accessing an input buffer.

FIG. 2 is an exemplary block diagram of hardware which is part of deinterleaving circuitry 36 for interrogating a memory 110 by a multiple pointer circuit 120. The memory 110 is preferably comprised in a processor, also comprehended by the reference numeral 110. The method and structure described herein may comprise instructions stored in the processor associated with the memory 110 to execute the method of embodiments of the invention. The multiple pointer circuit 120 comprises a plurality of address generator units (AGUs). As further described below, in the example for operating at 54 Mbps or 48 Mbps, three AGUs 122, 124 and 126 are provided. When operated, each AGU 122, 124 or 126 produces an output having a numerical value to read out a particular location of the memory 110. The sequence of operation location pointed to by each pointer is generated by a sequence controller 130, which may be a clock. The sequence controller 130 accesses the AGUs 122, 124 and 126 in order to provide the contents of a sequence of values from the memory 110 to the Viterbi decoder 38 directly. This is accomplished without the latency of an ordering operation.

The specific manner in which these values are accessed is described with respect to FIG. 3. Each of the columns correspond to different operating speeds as defined in the IEEE 802.11a standard. In successive rows different parameters are listed. Row a, lists the number of coded bits used per OFDM symbol ($N_{CBPS}$) This number of bits is specified in IEEE 802.11a. Row b represents the number of memory pointers to be utilized in preferred embodiment of the invention for a given data rate. Row c represents the pointer increment value in decimal form.

For example, in the first column, if the starting address of one pointer is 0, in the next loop iteration, it will look at buffer location 54. In row d, a starting address for each pointer is specified. The number of iterations required to interrogate all the memory locations is a function of the number of bits per OFDM symbol and the number of pointers used. For instance, to support 54 and 48 Mbps transmission speeds, a given symbol includes 288 bits. Since 3 pointers are used, each pointer will access 96 entries to cover all available metrics.

Row e lists the amount by which an address pointer should be decremented each time it over flows. Once an address register fetches the appropriate metric, its address is automatically incremented by a fixed stride (as described in row c). If the new address is bigger than the size of the metrics buffer (as described in row a), it means that the pointer has overflowed the buffer and a fix-up operation should occur. The fix-up values repeat themselves throughout the de-interleaving operation. For 54 and 48 Mbps, a total of 18 overflow operations will occur (of all 3 pointers) and the fix-up pattern repeats itself once every 3 overflows.

In short, pointers will be used to find metrics describing each bit in an OFDM symbol and supply the found metrics to the Viterbi decoder 38 in the embodiment of FIG. 1 (or the next processing element in the receiver pipeline.) Rows d and e in FIG. 3 disclose specific examples of an embodiment for each of a plurality of data rates. An understanding of the operation of the embodiment will enable those skilled in the art to provide many different forms of arrangements that differ from the embodiments described herein, which access the required metrics for provision to the Viterbi decoder 38 (or the next processing element in the receiver pipeline) so that operation in accordance with the present invention is performed.

The values produced by the AGUs 122, 124 and 126 are illustrated in FIG. 4. Pointer 1, pointer 2, and pointer 3 correspond to AGUs 122, 124 and 126 respectively. The location addresses are identified by their decimal value in FIGS. 3 and 4. One row in FIG. 4 corresponds to one cycle of the sequence controller 130 (FIG. 2) in which each of the AGUs 122, 124 and 126 are operated in order. One iteration comprises a pointer indexing through the register beginning with a starting address and advancing by an incremental value until overflow occurs.

In the embodiment of FIG. 3, for the case of a data rate equal to 54 or 48 Mbps, pointer 1 starts at address 0, pointer 2 starts at address 20, and pointer 3 starts at address 37. Pointers are successively incremented by a fixed decimal value of 54 to read a location having an address location 54 higher than the previous address. This increment is illustrated in FIG. 4. A clock synchronizing location of the pointers and locations at the Viterbi decoder 38 to which values are provided increments the pointers. This, is illustrated in FIG. 4.

Initially pointer 1 points to location 0, pointer 2 points to location 20, and pointer 3 points to location 37. Other combinations of initial locations could be provided. This particular set of initial locations is selected so that in view of the output of the de-interleaver operation, the metrics are de-interleaved per the formulas described above in equation (1). After the initial locations are accessed, the pointers are incremented by a decimal value of 54 so that pointer 1 points to location 54, pointer 2 points to location 74, and pointer 3 points to location 91. This iteration continues until an overflow occurs for each pointer. At the end of each iteration, after an overflow, the decimal address is decreased by the modulus specified in row e of FIG. 3.

At the end of iteration 0, pointer 1 overflows. The pointer is first incremented per the fixed-stride up to a value of 324. Only then, a fix-up operation (modulo operation by 286) is performed to access location 38, which is a decrease of a value of 232 (270 to 38). Thereafter, pointer 1 continues to be incremented by a value "54" each cycle.

Pointer 2 overflows after reaching a value of 236. At the first overflow of pointer 2, the value is decreased by 235 (236 to 1). Consequently, pointer 2 accesses location 1. Pointer 2 then continues to increment by 54 each time cycle.

Pointer 3 has an overflow value of 253. At the end of iteration N, pointer 3 is decreased by a value of 235 (253 to 18). Consequently, pointer 3 points to location 18. Similarly, pointer 3 is incremented 54 locations at a time until the next overflow.

Next, iteration 3N+1 for the value of N=0 begins. Pointer 1 increments until an overflow occurs at value 254. Similarly, pointer 2 increments through time t9, reaching a value of 271, which represents an overflow. At the end of iteration 3N+1, pointers 1 and 2 are decremented by 235. Pointers 1 and 2 begin iteration 3N+2 at addresses of 19 and 36 respectively. Pointer 3 overflows during iteration 3N+1 at a value of 234 and is decremented by 232. Pointer 3 begins iteration 3N+2 at location 2.

Pointers 1, 2, and 3 continue with their normal increments until the location of each pointer overflows. At the end of the duration 3N+2, pointer 1 is decremented by 232. Pointer 2 is decreased by 229, and pointer 3 is decreased by 232. In order to complete accessing of a symbol, operation continues as illustrated above for N=0 through N=5. The pattern of adjustments described above and summarized in FIG. 4, repeats itself every three iterations.

The de-interleaver algorithm receives a stream of metrics generated by the de-mapper algorithm. In most cases, in accordance with current practice, a metric is represented by 3 or 4 bits. In one embodiment of the invention, each metric is stored in one byte of memory. One byte is the smallest access size of "standard" address generation units (AGUs) or memory pointers. In a different embodiment, the access size can be the size of the metrics (e.g., 3-4 bits) or even more than 8-bits.

In FIG. 3, an embodiment of the invention in which the metrics (e.g., 8 bits) are encapsulated is illustrated. Other values may be used in other embodiments. As a result, the "smart" memory pointers will access bytes in the correct de-interleaved order. In a well-known manner, each memory pointer is provided with a minimum granularity of one byte. In this manner, the de-interleaving circuitry 36 does not write its output directly to an output buffer where the output buffer is a separate, intermediary stage between the de-interleaving circuitry 36 and the Viterbi decoder 38. Rather, the de-interleaving circuitry 36 is used directly by the next circuitry in the receive pipeline, namely the Viterbi decoder 38. It can also be used by the previous stage, so that the de-mapper will store the metrics directly in their de-interleaver order.

In operation, the memory pointers are used by the Viterbi decoder 38 to read the values of each pointer for its input. Once accessed, the de-interleaver algorithm advances the pointers by a fixed stride. (At some point in time, a synchronous operation may become practical.) The pointer location wraps around after reaching the end of the input buffer. Providing pointers with a fixed stride simplifies implementation. A fixed stride is necessarily used in conjunction with the feature of automatically incrementing the value of each pointer. This achieves a "smart" pointer function. Except for the addition of fix-up values, no additional operations are required; addition of "smart" pointers do all the indexing work. Therefore, most effective use of supporting hardware may be made. The adjustment to the pointer location after wraparound is by a "fix-up" value. "Fix-up" values are selected so that all buffer locations will be accessed and so that the pointers will periodically return to operating in the same iteration.

An example of a de-interleaving algorithm is as follows in Java code:

```
Initialize the pointers;
Loop as per number of iterations through input buffer:
{
    Viterbi algorithm accesses pointers for input values;
    Increment pointers as per stride;
    If (pointers overflows buffer)
        Adjust pointers as per the fix-up value
}
```

Figure 5:
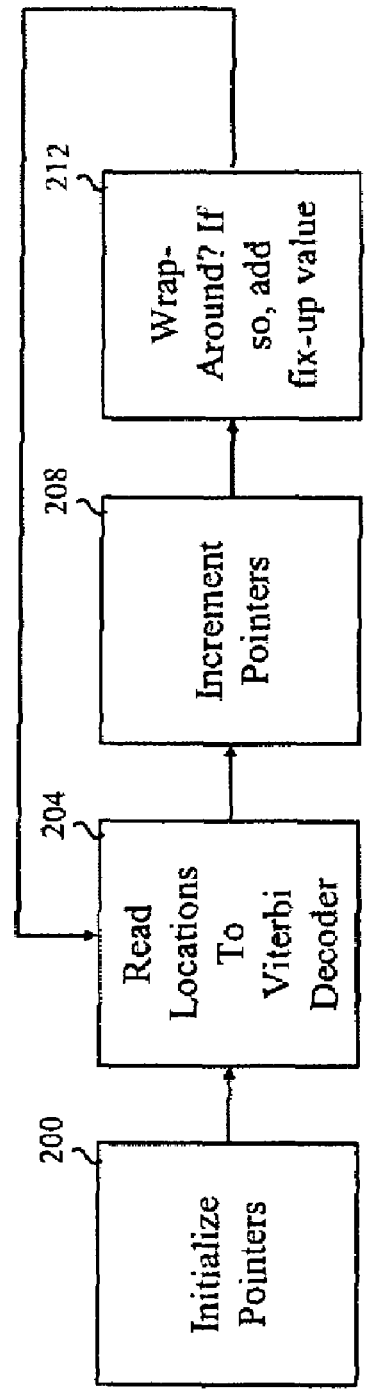
FIG. 5 is an exemplary flow chart illustrating operation of the present invention.

FIG. 5 is a flow chart illustrating operation. At block 200, the pointers 1, 2, and 3 are initialized. Once pointer locations are established, at block 204, their respective locations are used by the Viterbi decoder 38 (FIG. 2) to fetch the appropriate metrics from the input buffer. After their reading operation, each pointer is incremented at block 208. At block 212, a determination is made as to whether a wraparound occurred. If not, then the pointer is at a next location, which may again be read at block 204. If there is a wraparound, then the pointer should be identified and the iteration in which it is performing should be identified. This is for the purpose of accessing the correct fix-up value. The fix-up value is added (remembering that the fix-up value in the present example is negative) and a new location for the pointer is identified. Then again, at block 204, the location may be read.

During a first reading cycle, namely the period necessary to process an entire symbol, the Viterbi decoder 38 may process a symbol that was accessed at time period 0. At the same time, during the time period 1, the de-interleaving circuitry 36 is reading a symbol.

Advantages, particularly in a very long instruction word (VLIW) machine, are provided. In this machine the execution of the entire de-interleaver overhead can be performed entirely during the execution of the Viterbi decoder 38. An entire execution cycle is saved because it is not necessary to have a separate operating cycle to write the symbol to an additional register. Words are then provided. Each metric need be accessed only once from the time it is generated by the de-mapper algorithm. This reduces the total number of memory access operations needed to transfer symbol data from a de-interleaving stage 36 to a Viterbi decoder 38 by one-half. Further, no special memory buffer is required to store the de-interleaved stream of metrics.

Because operating cycles are saved, the operating frequency of a machine operating in accordance with embodiments of the present invention may be reduced. Consequently, total power consumption is reduced. This is particularly important in mobile apparatus.

Many different forms of the invention may be provided departing from the specific examples above while being provided in accordance with the present invention.

What is claimed is:

1. A method comprising:
accessing a memory having locations to store respective metrics of a transmitted symbol, the metrics being interleaved in an interleaved sequence and mapped in a transmission stream, the metrics in the memory locations each comprising de-mapped metric values;
accessing an individual location with a memory pointer;
reading one of the metrics from the individual location to a next stage in a receiver pipeline del-interleaved sequence; and
advancing the memory pointer by a fixed value and performing a wraparound upon reaching an overflow condition associated with the memory pointer.

2. The method according to claim 1 comprising periodically reading locations to provide the transmitted symbol to the next stage.

3. The method according to claim 1 comprising applying a fix-up value upon wraparound to adjust location of the memory pointer.

4. The method according to claim 3 comprising providing a plurality of memory pointers and accessing a separate group of locations with each memory pointer, an address of each memory pointer being increased by a fixed stride within its respective group locations.

5. The method according to claim 3 comprising providing a selectable number of memory pointers and selecting a number of memory pointers utilized in accordance with a protocol data rate.

6. A machine-readable medium that provides instructions which, when executed by a processor, causes said processor to perform operations comprising:
pointing to a location in a memory using a memory pointer, the location comprising a metric, and the memory being loaded with metrics from a transmission stream that has been interleaved and mapped in accordance with a transmission protocol and de-mapped to locations in the memory;
reading each memory location to a next stage in a receiver pipeline; and
advancing the memory pointer by a fixed value and performing a wraparound upon reaching an overflow condition associated with the memory pointer.

7. The machine-readable medium according to claim 6, wherein the instructions further cause said memory pointer to read said metrics in a non-consecutive succession.

8. The machine-readable medium according to claim 6, wherein the instructions further cause the processor to perform an operation of applying a fix-tip value upon performing the wraparound to adjust location of the memory pointer.

9. The machine-readable medium according to claim 8, wherein the instructions further cause the processor to perform an operation of providing a plurality of memory pointers.

10. The machine-readable medium according to claim 9, wherein the instructions further cause the processor to perform an operation of providing a selectable number of memory pointers and selecting a number of memory pointers utilized in accordance with a protocol data rate.

11. A de-interleaver to de-interleave a received de-mapped stream from a digital transmission stream that has been interleaved and mapped in accordance with a transmission protocol, comprising:
metrics delivered to a memory having locations comprising at least one memory pointer for reading a metric in a memory location; and
a reader reading said at least one memory pointer to a next location in a receiver pipeline and providing a fix-up value when said at least one memory pointer overflows locations in said memory.

12. The de-interleaver according to claim 11 further comprising a sequence controller for repeatedly accessing said memory by said at least one memory pointer.

13. The de-interleaver according to claim 12 comprising a plurality of memory pointers.

14. The de-interleaver according to claim 13 wherein said next location in said receiver pipeline comprises a Viterbi decoder and wherein said sequence controller accesses locations of said memory indicative of a symbol within a processing cycle of said Viterbi decoder.

15. A method comprising:
accessing a memory having locations to store respective metrics of a transmitted symbol, the metrics being interleaved in an interleaved sequence, the metrics in the memory locations each comprising metric values;
accessing an individual location with a memory pointer;
reading the metric from the individual location to a next stage of a de-interleaved sequence; and
advancing the memory pointer by a fixed value and performing a wraparound upon reaching an overflow condition associated with the memory pointer.

16. The method according to claim 15 further comprising periodically reading locations to provide the transmitted symbol to the next stage.

17. A method comprising:
receiving interleaved data to be de-interleaved;
generating de-interleaved data streams based on the interleaved data by de-interleaving circuitry;
storing each de-interleaved data stream in a corresponding de-interleaved memory location using a plurality of memory pointers;
reading the de-interleaved data streams by component performing operations after the de-interleaving circuitry; and
advancing a memory pointer of the plurality of memory pointers by a fixed stride and wrapping around when reaching an end of memory location.

18. The method of claim 17, wherein the reading of the de-interleaved data streams is performed by a decoder.

19. The method of claim 17, wherein at least one de-interleaved data stream is a metric describing a bit of an Othogonal Frequency Division Multiplexing (OFDM) symbol.

20. The method of claim 17, wherein prior to storing each de-interleaved data stream, the method further comprising providing the plurality of memory pointers and accessing a separate group of locations with each memory pointer, an address of each memory pointer being increased by a fixed stride within its respective group locations.

21. The method of claim 17, wherein prior to storing each de-interleaved data stream, the method further comprising providing a selectable number of memory pointers and selecting a number of memory pointers utilized in accordance with a protocol data rate.

* * * * *